United States Patent
Danilov et al.

(10) Patent No.: US 10,594,340 B2
(45) Date of Patent: Mar. 17, 2020

(54) DISASTER RECOVERY WITH CONSOLIDATED ERASURE CODING IN GEOGRAPHICALLY DISTRIBUTED SETUPS

(71) Applicant: EMC IP Holding Company LLC, Hopkinton, MA (US)

(72) Inventors: Mikhail Danilov, Saint Petersburg (RU); Maksim Vazhenin, Saint Petersburg (RU)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 21 days.

(21) Appl. No.: 16/010,322

(22) Filed: Jun. 15, 2018

(65) Prior Publication Data

US 2019/0386683 A1    Dec. 19, 2019

(51) Int. Cl.
| | | |
|---|---|---|
| *G11C 29/00* | (2006.01) | |
| *H03M 13/15* | (2006.01) | |
| *G06F 11/10* | (2006.01) | |
| *G06F 3/06* | (2006.01) | |
| *H03M 13/00* | (2006.01) | |

(52) U.S. Cl.
CPC .......... *H03M 13/154* (2013.01); *G06F 3/065* (2013.01); *G06F 3/067* (2013.01); *G06F 3/0619* (2013.01); *G06F 3/0644* (2013.01); *G06F 11/1076* (2013.01); *H03M 13/616* (2013.01)

(58) Field of Classification Search
CPC .. G06F 11/1076; G06F 3/061; G06F 11/1092; G06F 2211/1028; G06F 11/0751; G06F 11/0709; G06F 11/0727; G06F 11/106; G06F 3/0619; G06F 3/0644; G06F 3/065; G06F 3/067; H04L 67/1097; H04L 9/3247; H04L 2209/30; H03M 7/30; H03M 13/154; H03M 13/616
See application file for complete search history.

(56) References Cited

U.S. PATENT DOCUMENTS

| | | |
|---|---|---|
| 9,208,009 B2 | 12/2015 | Resch et al. |
| 2008/0222480 A1 | 9/2008 | Huang et al. |
| 2008/0222481 A1 | 9/2008 | Huang et al. |
| 2008/0244353 A1 | 10/2008 | Dholakia et al. |
| 2009/0183056 A1 | 7/2009 | Aston |

(Continued)

OTHER PUBLICATIONS

Notice of Allowance received for U.S. Appl. No. 15/862,547 dated Mar. 29, 2019 27 pages.

(Continued)

*Primary Examiner* — Guerrier Merant
(74) *Attorney, Agent, or Firm* — Amin, Turocy & Watson, LLP

(57) ABSTRACT

Processing load and incoming inter-zone network traffic for remote zones during geographically distributed (GEO) erasure coding can be reduced. In one aspect, GEO erasure coding can be performed in multiple phases, wherein each phase can be distributed between zones. Moreover, during a first phase, partially-finished coding chunks can be generated by frontend zones. Further, during an intermediate phase, partially-finished coding chunks that are associated with a common coding chunk can be transferred between the frontend zones and combined to generate consolidated partial coding chunks. Furthermore, during a final phase, the remote zones can receive and combine the consolidated partial coding chunks to generate a complete coding chunk that can be utilized for data recovery.

20 Claims, 13 Drawing Sheets

(56) References Cited

U.S. PATENT DOCUMENTS

| | | |
|---|---|---|
| 2009/0240880 A1 | 9/2009 | Kawaguchi |
| 2011/0029836 A1 | 2/2011 | Dhuse et al. |
| 2011/0106972 A1 | 5/2011 | Grube et al. |
| 2011/0107165 A1 | 5/2011 | Resch et al. |
| 2012/0191675 A1 | 7/2012 | Kim et al. |
| 2012/0311395 A1 | 12/2012 | Leggette et al. |
| 2013/0238932 A1 | 9/2013 | Resch |
| 2013/0290482 A1 | 10/2013 | Leggette |
| 2014/0040417 A1 | 2/2014 | Galdwin et al. |
| 2014/0115182 A1 | 4/2014 | Sabaa et al. |
| 2014/0164694 A1 | 6/2014 | Storer |
| 2014/0281804 A1 | 9/2014 | Resch |
| 2014/0331100 A1 | 11/2014 | Dhuse et al. |
| 2015/0074065 A1 | 3/2015 | Christ et al. |
| 2015/0112951 A1 | 4/2015 | Narayanamurthy et al. |
| 2015/0142863 A1 | 5/2015 | Yuen et al. |
| 2015/0178007 A1 | 6/2015 | Moisa et al. |
| 2015/0186043 A1 | 7/2015 | Kesselman et al. |
| 2016/0378624 A1 | 12/2016 | Jenkins, Jr. et al. |
| 2017/0017671 A1 | 1/2017 | Baptist et al. |
| 2017/0031945 A1 | 2/2017 | Sarab et al. |
| 2017/0187766 A1 | 6/2017 | Zheng et al. |
| 2018/0267985 A1 | 9/2018 | Badey et al. |
| 2019/0114223 A1 | 4/2019 | Pydipaty et al. |
| 2019/0215017 A1 | 7/2019 | Danilov et al. |

OTHER PUBLICATIONS

Non-Final Office Action received for U.S. Appl. No. 15/792,714 dated Apr. 4, 2019, 20 pages.
Final Office Action received for U.S. Appl. No. 15/792,714 dated Sep. 12, 2019, 43 pages.
Wikipedia "Garbage Collection", URL: https://en.wikipedia.org/wiki/Garbage_collection_(computer science) #Availability (Year: 2017) retrieved using the WayBackMachine, Sep. 8, 2017, 8 pages.
Wikipedia "Erasure code", URL: https://web.archive.org/web/20170908171158/https://en.wikipedia.org/Wiki/ Erasure_code (Year: 2017), retrieved using the WayBackMachine, Sep. 8, 2017, 5 pages.
Wikipedia "Front and back ends" URL: https://en.wikipedia.org/wiki/Front_and_back_ends (Year:2019), Sep. 6,2019, 4 pages.
Notice of Allowance received for U.S. Appl. No. 15/792,714 dated Nov. 8, 2019 31 pages.
Non-Final Office Action received for U.S. Appl. No. 15/791,390 dated Sep. 20, 2019, 27 pages.

DISASTER RECOVERY WITH CONSOLIDATED ERASURE CODING IN GEOGRAPHICALLY DISTRIBUTED SETUPS

TECHNICAL FIELD

The subject disclosure relates generally to storage systems that utilize distributed erasure coding. More specifically, this disclosure relates to disaster recovery with consolidated erasure coding.

BACKGROUND

The large increase in amount of data generated by digital systems has created a new set of challenges for data storage environments. Traditional storage area network (SAN) and/or network-attached storage (NAS) architectures have not been designed to support data storage or protection at large multi-petabyte capacity levels. Object storage technology can be utilized to meet these requirements. By utilizing object storage technology, organizations can not only keep up with rising capacity levels, but can also store these new capacity levels at a manageable cost point.

Typically, a scale-out, cluster-based, shared-nothing object storage that employs a microservices architecture pattern, for example, an Elastic Cloud Storage (ECS™) can be utilized as a storage environment for a new generation of workloads. ECS™ utilizes the latest trends in software architecture and development to achieve increased availability, capacity use efficiency, and performance. ECS™ uses a specific method for disk capacity management, wherein disk space is partitioned into a set of blocks of fixed size called chunks. User data is stored in these chunks and the chunks are shared. One chunk can contain fragments of several user objects. Chunk content is modified in an append mode. When chunks become full, they are sealed and the content of sealed chunks is immutable.

A corresponding feature of ECS™ supports geographically distributed setups (GEO) comprising two or more zones. When three or more zones are employed, each zone may receive chunks from other zones and the zones can combine the chunks. This type of cluster-based storage of several racks supports cluster nodes that communicate with each other. One cluster may be located in one data center and another cluster can be located in a remote data center. Although the geographically distributed setups can be used to provide an additional protection of user data by means of replication, the replication mechanism works at the chunks level.

The above-described background relating to ECS™ is merely intended to provide a contextual overview of some current issues, and is not intended to be exhaustive. Other contextual information may become further apparent upon review of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its sole purpose is to present some concepts of the specification in a simplified form as a prelude to the more detailed description that is presented in this disclosure.

Example systems and methods disclosed herein relate to facilitating distributed erasure coding to load balance between different geographical zones of a distributed storage system and reduce incoming traffic for remote/backend zones. In one example embodiment, a system is disclosed that comprises a processor and a memory that stores executable instructions that, when executed by the processor, facilitate performance of operations. Moreover, the operations comprise receiving a first consolidated partial coding chunk from a first zone of a group of zones of a geographically distributed storage system, wherein the first consolidated partial coding chunk is determined based on performing a first portion of an erasure coding operation that combines first partial coding chunks that are determined based on encoding data chunks stored within the group of zones, and receiving a second consolidated partial coding chunk from a second zone of the group of zones, wherein the second consolidated partial coding chunk is determined based on performing the first portion of the erasure coding operation that combines second partial coding chunks that are determined based on encoding the data chunks. Further, the operations comprise performing a second portion of the erasure coding operation that comprises combining the first consolidated partial coding chunk and the second consolidated partial coding chunk to generate a final coding chunk.

Another example embodiment of the specification relates to a method that comprises receiving, by a system comprising a processor, a first consolidated partial coding chunk from a first zone of zones within a geographically distributed storage system, wherein the first consolidated partial coding chunk has been determined based on aggregating first partial coding chunks that have been determined based on encoding data chunks stored within the zones by utilizing a defined erasure coding protocol, and receiving, by the system, a second consolidated partial coding chunk from a second zone of the zones, wherein the second consolidated partial coding chunk has been determined based on aggregating second partial coding chunks that have been determined based on encoding the data chunks. According to an aspect, the method further comprises based on aggregating the first consolidated partial coding chunk and the second consolidated partial coding chunk determining, by the system, a final coding chunk that is employable for recovery of at least one of the data chunks during a failure.

Another example embodiment of the specification relates to a computer-readable storage medium comprising instructions that, in response to execution, cause a computing node device comprising a processor to perform operations, comprising in response to determining that data chunks stored within respective zones of a geographically distributed storage system are to be protected via erasure coding, determining groups of partial coding chunks that are partially encoded versions of the data chunks; transferring of a portion of the groups of partial coding chunks between the zones to facilitate a determination of consolidated partial coding chunks, wherein a consolidated partial coding chunk, of the consolidated partial coding chunks, is generated based on combining a set of the partial coding chunks that are determined to be related to a common complete coding chunk; and facilitating a replication of the consolidated partial coding chunk to a remote zone of the geographically distributed storage system to facilitate a generation of the common complete coding chunk that is employable to recover at least one of the data chunks during a failure.

The following description and the drawings set forth certain illustrative aspects of the specification. These aspects are indicative, however, of but a few of the various ways in

DETAILED DESCRIPTION

Figure 1:
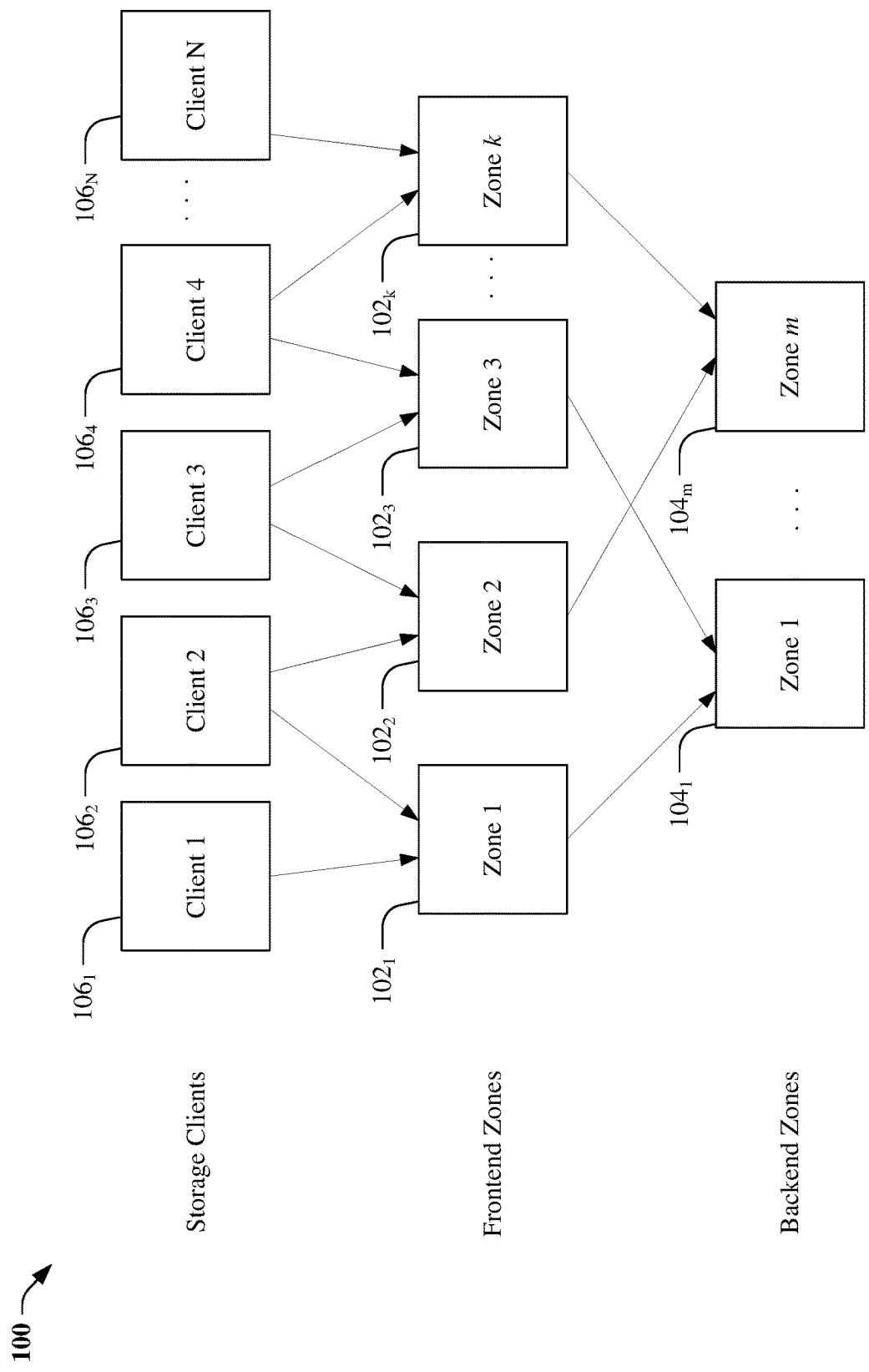
FIG. 1 illustrates an example storage system that facilitates distributed erasure coding.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The term "cloud" as used herein can refer to a cluster of nodes (e.g., set of network servers), for example, within a distributed object storage system, that are communicatively and/or operatively coupled to each other, and that host a set of applications utilized for servicing user requests. In general, the cloud computing resources can communicate with user devices via most any wired and/or wireless communication network to provide access to services that are based in the cloud and not stored locally (e.g., on the user device). A typical cloud-computing environment can include multiple layers, aggregated together, that interact with each other to provide resources for end-users.

Example systems and methods disclosed herein, in one or more embodiments, relate to cloud storage systems that utilize erasure coding for data protection, such as, but not limited to an elastic cloud storage (ECS™) platform. The ECS™ platform combines the cost advantages of commodity infrastructure with the reliability, availability and serviceability of traditional arrays. In one aspect, the ECS™ platform can comprise a cluster of nodes (also referred to as "cluster" herein) that delivers scalable and simple public cloud services with the reliability and/or control of a private-cloud infrastructure. Moreover, the ECS™ platform comprises a scale-out, cluster-based, shared-nothing object storage, which employs a microservices architecture pattern. The ECS™ platform can support storage, manipulation, and/or analysis of unstructured data on a massive scale on commodity hardware. As an example, ECS™ can support mobile, cloud, big data, content-sharing, and/or social networking applications. ECS™ can be deployed as a turnkey storage appliance or as a software product that can be installed on a set of qualified commodity servers and/or disks. The ECS™ scale-out and geo-distributed architecture is a cloud platform that can provide at least the following features: (i) lower cost than public clouds; (ii) unmatched combination of storage efficiency and data access; (iii) anywhere read/write access with strong consistency that simplifies application development; (iv) no single point of failure to increase availability and performance; (v) universal accessibility that eliminates storage silos and inefficient extract, transform, load (ETL)/data movement processes; etc.

In an aspect, ECS™ does not rely on a file system for disk capacity management. Instead, ECS™ partitions disk space into a set of blocks of fixed size called chunks (e.g., having a chunk size of 128 MB). All user data is stored in these chunks and the chunks are shared. Typically, a chunk can comprise fragments of several different user objects. The chunk content can be modified in an append-only mode. When a chunk becomes full, it can be sealed and the content of a sealed chunk is immutable. Further, ECS™ does not employ traditional data protection schemes like mirroring or parity protection. Instead, ECS™ utilizes erasure coding for protection of the data chunks. Although the systems and methods disclosed herein have been described with respect to object storage systems (e.g., ECS™), it is noted that the subject specification is not limited to object storage systems and can be utilized for most any geo-distributed storage systems that utilize erasure coding for data protection.

Example systems and methods disclosed herein, in one or more embodiments, relate to geographically distributed (GEO) erasure coding, which inherits all the issues of GEO XOR except low scalability. Typically, organizations protect against outages or information loss by backing-up (e.g., replicating) their data periodically. During backup, one or more duplicate or deduplicated copies of the primary data are created and written to a new disk or to a tape. For disaster recovery purposes, a backup copy can be transported or replicated offsite to ensure the data is safe in the event of a disaster (e.g. resulting in a site-wide failure). A single point of failure is a risk of data loss and/or system unavailability. A single device, building, metropolitan area, power grid, natural disaster zone (e.g., flood zone, earthquake zone, hurricane zone, etc.), accident/attack zone (e.g., malicious attack) can represent a single point of failure. Redundancy and the distance that spans those points of failure can enable disaster recovery to keep the organizations operating smoothly regardless of the cause of the unplanned outage. In some scenarios, ECS™ can utilize an XOR technique to minimize capacity overhead associated with GEO data protection. However, the XOR technique is not scalable and the use of GEO XOR can enable a distributed storage to recover data from a failure of a single zone and/or cluster and/or chunk in the distributed storage. However, GEO XOR cannot be utilized to recover data from a dual failure or from more complicated failures.

In one aspect, the systems and methods herein relate to providing disaster recovery by utilizing GEO erasure coding, wherein data can be replicated on storage devices deployed at different physical locations (e.g., at geographically separated zones/sites around the world). Thus, data can easily be recovered if one or more zones/sites experience an outage/failure (e.g., dual failure or more complicated failure). Erasure coding can be used to protect data on geographically distributed storages instead of basic XOR. However, there are several challenges with inter-zone network traffic efficiency.

Erasure coding was created as a forward error correction method for binary erasure channel. However, erasure coding can be used for data protection on data storages. During erasure coding, a piece of data can be divided into k data fragments of equal size. During encoding, redundant m coding fragments are created so that the system can tolerate the loss of any m fragments. The process of coding fragments creation is called encoding. The process of data fragments recovery using available data and coding fragments is called decoding.

If a distributed storage is to tolerate the loss of any m zones/clusters/chunks, then GEO erasure coding can begin at each zone by replicating each new chunk to at least m remote zones. As a result, there are m backup copies of each chunk. Typically, there is one primary backup copy, which can be utilized for encoding. Encoding is performed by one zone for primary backup chunks and other zones replicate to it. Once a zone has k primary chunks replicated from different remote zones, the zone can perform encoding using the chunks replicated to it as data fragments. The chunk size is fixed, in ECS™, with padding or other data to complement, wherein the other data is added as needed. The result of encoding is m data portions of a chunk size. They are stored as chunks of a specific type called coding chunks. After encoding is complete, the zone can store one coding chunk locally and move other m−1 coding chunks to remote zones making sure all the k+m data and coding chunks are stored at different zones whenever possible. Afterwards, the primary backup chunks used for encoding and their peer backup chunks at other zones can be deleted.

The above encoding operation can be very resource-demanding. Typically, it is normal to have a considerable lag between new data creation and encoding for systems with high load. However, this can create challenges during distributed erasure coding. For example, backend zones can become overloaded with encoding. In this example scenario, until data protection with GEO erasure coding is completed, backup copies of data in each backend zone occupy k times more capacity than primary data copies in each frontend zone and thus, the backend zones can quickly run out of capacity. This can result in stuck replication and new data created within frontend zones can become vulnerable. Further, backend zones can produce unwanted inter-zone network traffic while distributing coding fragments between themselves. Meanwhile, inter-zone network traffic can be already high because of replication of each data chunks to m backend zones.

To reduce load for backend zones and reduce inter-zone network traffic, encoding can be performed in two phases and each phase can be distributed between geographical zones. For example, during a first encoding phase, frontend zones can generate partially finished coding chunks and transfer them to respective backend zones. Further, during a second encoding phase, the backend zones can generate complete coding chunks independently and in parallel (e.g., without transferring data to other backend zones). Although this two-phase encoding eliminates inter-zone network traffic that is traditionally produced during coding fragments distribution between backend zones, the incoming network traffic for the backend zones (e.g., from the frontend zones) can be substantial. In general, incoming network traffic for a backend zone is k times greater than incoming network traffic for a frontend zone. For example, backend zones are to get tenfold input network traffic with 10+2 (k+m; k=10, m=2) erasure coding protection scheme. The systems and methods disclosed herein facilitate efficient data protection with GEO erasure coding by reducing traffic received by the backend zones. Moreover, the systems and methods disclosed herein can be implemented in most any geo-distributed storage systems that utilize a k+m erasure coding configuration, wherein k mod m=0.

Referring initially to FIG. 1, there illustrated is an example storage system 100 configured to perform distributed erasure coding. Typically, in a geographically distributed data storage system, chunks from frontend storage devices (e.g., within frontend zones $102_1$-$102_k$) can be replicated on a backend storage device (e.g., within backend zones $104_1$-$104_m$). As an example, frontend storage devices can comprise storage devices that are generally designated, configured, etc., explicitly as a user-facing storage device that communicate with storage clients 1-N ($106_1$-$106_N$; wherein N is most any natural number) and can create chunks from user data received from the storage clients 1-N ($106_1$-$106_N$). In contrast, backend storage devices can comprise storage devices that are generally designated, configured, etc., explicitly as non-user-facing storage devices that store chunks from front-end devices but that typically don't receive user data to create new chunks. Generally, a frontend storage device and a backend storage device are not interchangeable without re-configuration to an operator designated frontend or backend data storage role.

For a k+m erasure coding protection protocol, the storage clients 1-N ($106_1$-$106_N$) can interface with k frontend zones $102_1$-$102_k$, which can store data fragments of a data chunk. Further, m backend zones $104_1$-$104_m$ can be utilized to store coding fragments for the data chunk. Moreover, the backend zones $104_1$-$104_m$ are replication targets/destinations for the frontend zones $102_1$-$102_k$. In an aspect, the backend zones $104_1$-$104_m$ are solely used to generate and store coding chunks for all the data chunks produced by and/or stored within the frontend zones $102_1$-$102_k$. By employing the k+m erasure coding protection protocol, system 100 can recover any m zone, cluster, and/or chunk failures.

According to an embodiment, system 100 can facilitate a three-phase encoding operation that is distributed between the frontend zones $102_1$-$102_k$ and the backend zones $104_1$-$104_m$. During a first phase, the frontend zones $102_1$-$102_k$ can generate a group of partially-finished coding chunks for data chunks that are to be replicated/protected. As an example, the group of partially-finished coding chunks can be generated by combining (e.g., multiplying) a data chunk with corresponding coefficients from a defined coding matrix. Further, during a second phase, the frontend zones $102_1$-$102_k$ can generate consolidated partial coding chunks, for example, based on combining groups of partially-finished coding chunks generated by different frontend zones $102_1$-

$102_k$. Furthermore, during a third phase, the consolidated partial coding chunks can be transferred to respective backend zones $104_1$-$104_m$, which can combine the received data to generate and store complete coding chunks that can be utilized for data recovery (e.g., in case the data chunk is lost/unavailable).

Figure 2:
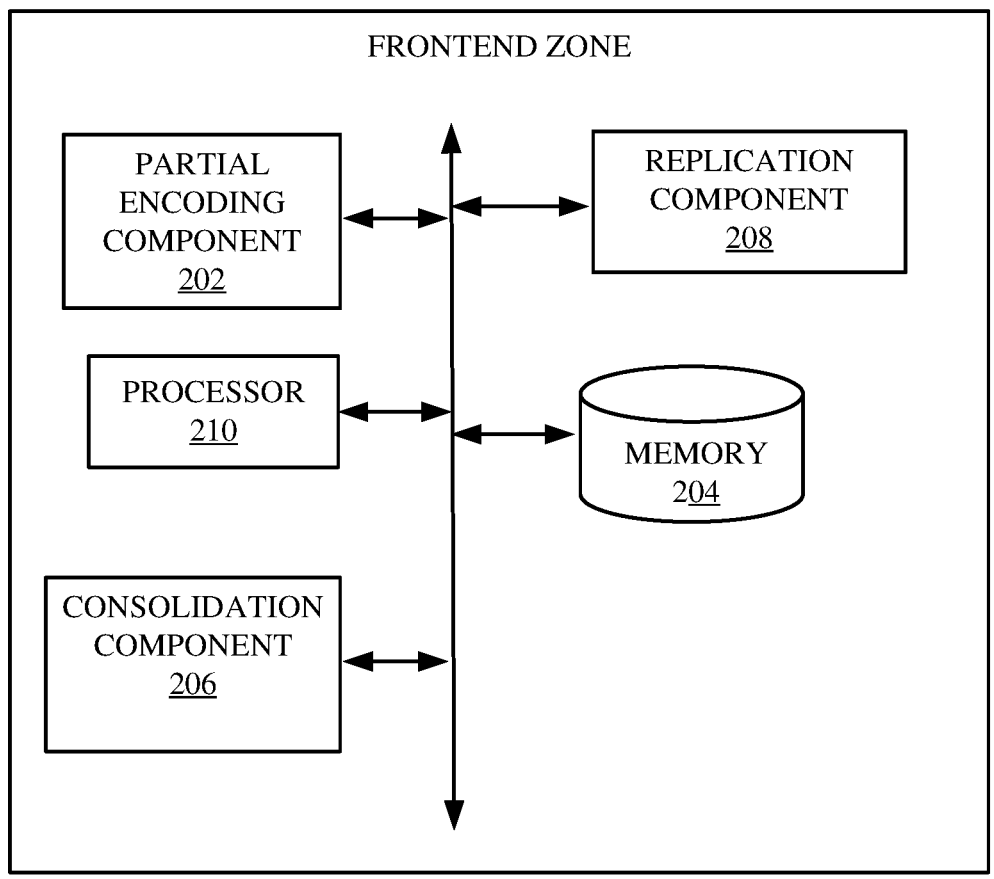
FIG. 2 illustrates an example frontend zone configured to perform distributed erasure coding.

FIG. 2 illustrates an example frontend zone 200 configured to perform distributed erasure coding. As an example, a frontend zone 200 can comprise one or more nodes that can accept storage requests (e.g., read and/or write requests) from storage clients and can store data chunks within memory 204. In one aspect, frontend zone 200 can be substantially similar to frontend zones $102_1$-$102_k$ and can include functionality as more fully described herein, for example, as described above with regard to frontend zones $102_1$-$102_k$.

In the embodiment shown in FIG. 2, the frontend zone 200 can comprise a partial encoding component 202 that can generate a portion of an encoding operation utilized during erasure coding. For example, the encoding operation can be represented with the equation below:

$$C_i = \Sigma_{j=1}^{k} C_{i,j}$$

wherein, $$C_{i,j} = X_{i,j} * D_j \quad (2)$$

and wherein, $X_{i,j}$ are defined coefficients from a coding matrix. Further, $D_j$ are independent data chunks and $C_i$ are coding chunks. All data/coding chunks united in one protection set are stored in different zones. According to an embodiment, the partial encoding component 202 can determine a set of partial coding chunks, $C_{i,j}$ for data chunks $D_j$ that are stored within the frontend zone 200 (e.g., within memory 204). This first phase of the encoding operation can be performed in parallel (e.g., simultaneously and/or substantially simultaneously) by different frontend zones. Since, $D_j$ is stored in locally and $X_{i,j}$ is a defined coefficient (e.g., stored within memory 204), the first phase does not utilize inter-zone network traffic/communication.

In an aspect, a consolidation component 206 can be utilized to facilitate a generation of a consolidated partial coding chunk. Moreover, a consolidated partial coding chunk is generated by combining partial coding chunks, $C_{i,j}$, from frontend zones that belong to a consolidation group. As an example, the frontend zones are divided into consolidating groups, wherein each consolidating group comprises m zones. In one example, the consolidation component 206 can receive a partial coding chunk(s) from another frontend zone(s) and combine (e.g., sum) the received information with a determined partial coding chunk to generate the consolidated partial coding chunk. In another example, the consolidation component 206 can transmit a determined partial coding chunk(s) to another frontend zone(s), which can then combine (e.g., sum) the transmitted information with a determined partial coding chunk to generate another consolidated partial coding chunk. This second phase of the encoding operation can also be performed in parallel (e.g., simultaneously and/or substantially simultaneously) by different frontend zones. After generation of the consolidated partial coding chunk(s), the partially-finished coding chunks can be deleted from memory 204.

A replication component 208 can replicate the consolidated partial coding chunks ($C_{i,j}$) (e.g., generated by the consolidation component 206) to destination zones (e.g., remote/backend zones). In one aspect, all consolidated partial coding chunks of one finished/complete coding chunk are to be replicated to a specific destination zone. In an example scenario wherein, m backend zones are utilized, the backend zones can be ordered by an identifier (e.g., name, serial number, etc.) such that chunks $C_{1,j}$ are replicated to a first backend zone, chunks $C_{2,j}$ are replicated to a second backend zone, and so on. After replication, the consolidated partial coding chunks can be deleted from memory 204. It should be noted that replicating the consolidated partial coding chunks can occur by copying the consolidated partial coding chunks at their respective zones and then sending a copied data chunk to a remote zone (e.g., backend zone), or the remote zone can be in bi-directional communication with a first zone, wherein a copy of the consolidated partial coding chunk of the first zone is created remotely at the remote zone.

Aspects of the processor 210 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described herein. In an aspect, memory 204 can store computer executable components and instructions. It is noted that the memory 204 can comprise volatile memory(s) or nonvolatile memory(s), or can comprise both volatile and nonvolatile memory(s). Examples of suitable types of volatile and non-volatile memory are described below with reference to FIG. 13. The memory (e.g., data stores, databases) of the subject systems and methods is intended to comprise, without being limited to, these and any other suitable types of memory. In one example, frontend zone 200 can be part of most any object storage system such as, but not limited to, Dell EMC® Elastic Cloud Storage (ECS™).

Figure 3:
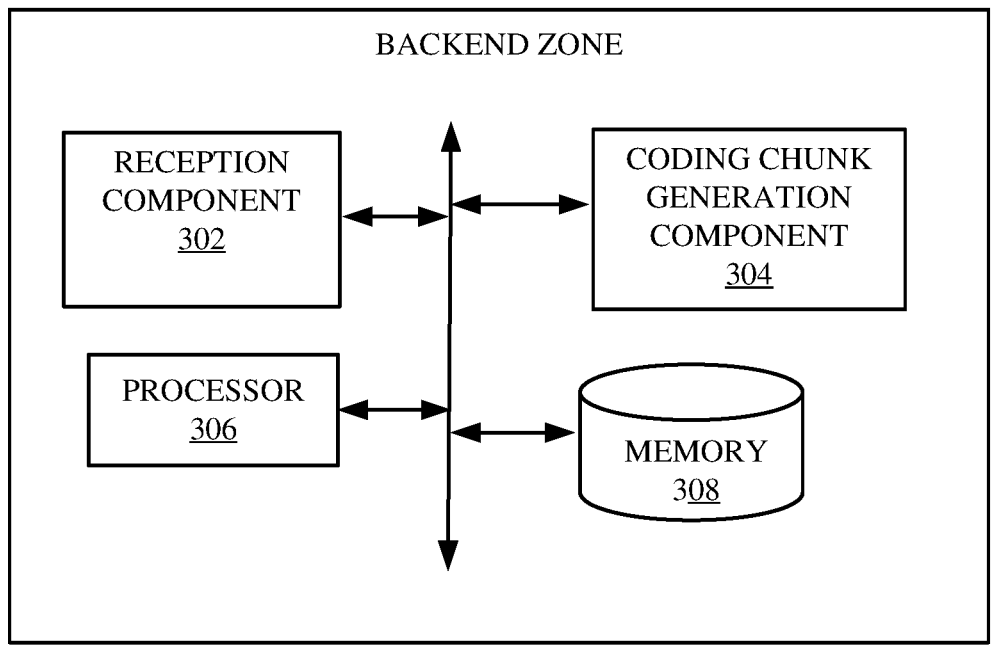
FIG. 3 illustrates an example backend zone configured to perform distributed erasure coding.

FIG. 3 illustrates an example backend zone 300 configured to perform distributed erasure coding. As an example, the backend zone 300 can comprise one or more nodes utilized as replication targets/destinations for the frontend zones. Moreover, the backend zone 300 can be solely utilized to produce and store coding chunks for all the data chunks generated by the frontend zones. In the embodiment shown in FIG. 3, the backend zone 300 can comprise a reception component 302 that can receive consolidated partial coding chunks from frontend zones (e.g., frontend zone 200). In an aspect, the reception component 302 can receive one consolidated partial coding chunk per consolidating group of frontend zones. Accordingly, input network traffic for the backend zone 300 is reduced (e.g., by k/m times).

A coding chunk generation component 304 can be utilized to combine (e.g., add) the consolidated partial coding chunks to generate a complete coding chunk. In one aspect, different backend zones can generate respective coding chunks $C_i$ simultaneously or in parallel. As an example, $C_i$ is a sum of $C_{i,j}$ provided by the frontend zones. The result of the sum is stored locally (e.g., to memory 308) as a complete/finished coding chunk $C_i$. This is the final phase of encoding. After all the complete/finished coding chunks are stored in memory 308, the source partially-finished coding chunks can be deleted from memory 204.

Aspects of the processor 306 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described herein. In an aspect, memory 308 can store computer executable components and instructions. It is noted that the memory 308 can comprise volatile memory(s) or nonvolatile memory(s), or can comprise both volatile and nonvolatile memory(s). Examples of suitable types of volatile and non-volatile memory are described below with reference to FIG. 13. In one example, backend zone 300 can be part of most any object storage system such as, but not limited to, Dell EMC® Elastic Cloud Storage (ECS™).

Figure 4:
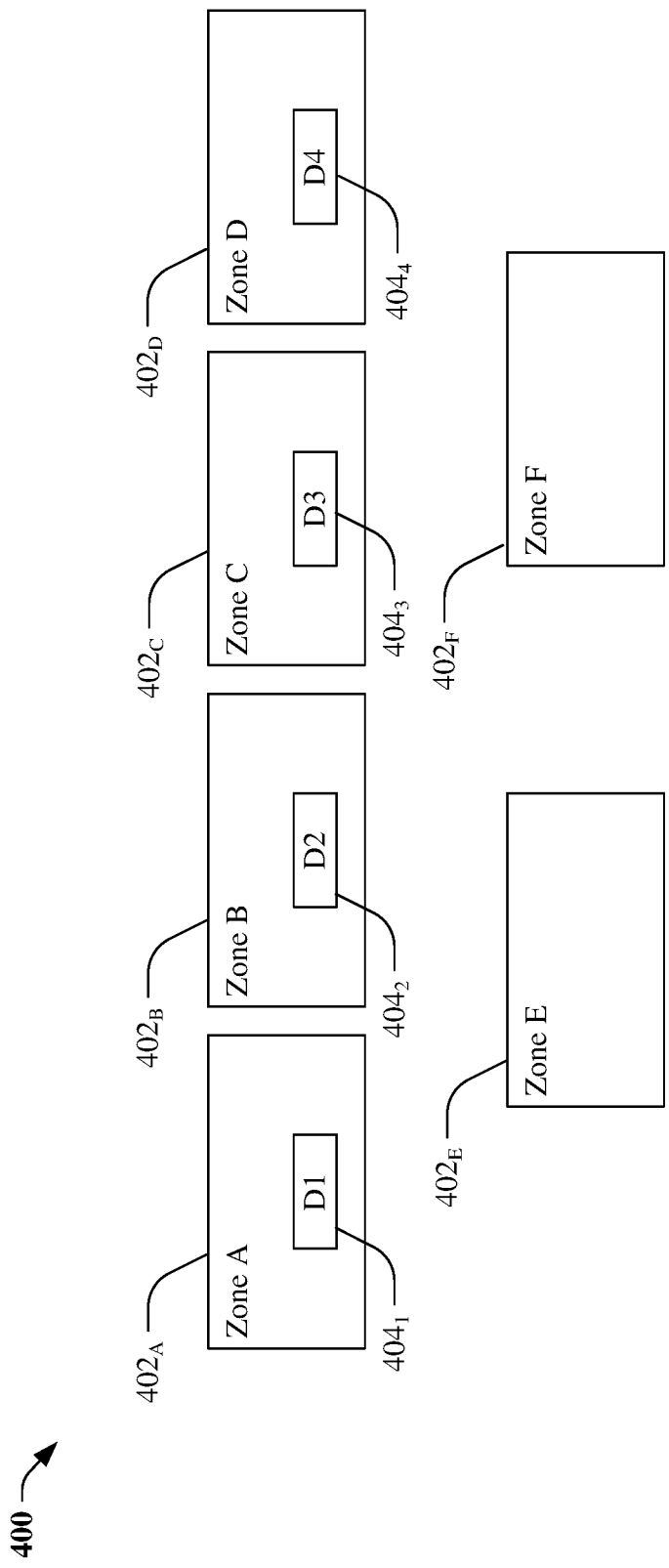
FIG. 4 illustrates an example system with data chunks that are to be protected with geographically distributed erasure coding.

Referring now to FIG. 4, there is illustrated an example system 400 comprising four data chunks protected with GEO distributed erasure coding. System 400 comprises are six distributed zones, zone A $402_A$, zone B $402_B$, zone C $402_C$, zone D $402_D$, zone E $402_E$, and zone F $402_F$. As an example, the zones A-F can be geographically dispersed systems that are linked via a wide area network (WAN) to bi-directionally replicate data among the zones. The geo-replication ensures that the data is protected against site failures and/or disasters.

In one example layout, four data chunks, D1 $404_1$, D2 $404_2$, D3 $404_3$, and D4 $404_4$, can be stored to zone A $402_A$, zone B $402_B$, zone C $402_C$, and zone D $402_D$, respectively. In one aspect, zone A $402_A$, zone B $402_B$, zone C $402_C$, and/or zone D $402_D$ can be substantially similar to frontend zones $102_1$-$102_k$ and/or frontend zone 200 and can include functionality as more fully described herein, for example, as described above with regard to frontend zones $102_1$-$102_k$ and/or frontend zone 200. Further, zone E $402_E$ and zone F $402_F$ are typically utilized to store coding chunks utilized for data protection associated with the data chunks (D1-D4). In one aspect, zone E $402_E$ and/or zone F $402_F$ can be substantially similar to backend zones $104_1$-$104_m$ and/or backend zone 300 and can include functionality as more fully described herein, for example, as described above with regard to backend zones $104_1$-$104_m$ and/or backend zone 300. In this example scenario, a 4+2 (k+m; k=4 and m=2) erasure coding configuration can be utilized. It is noted that although six zones with a 4+2 erasure coding configuration are described herein, the subject disclosure is not that limited and that fewer or greater number of zones can be deployed with most any k+m erasure coding configuration (wherein k mod m=0).

Figure 5:
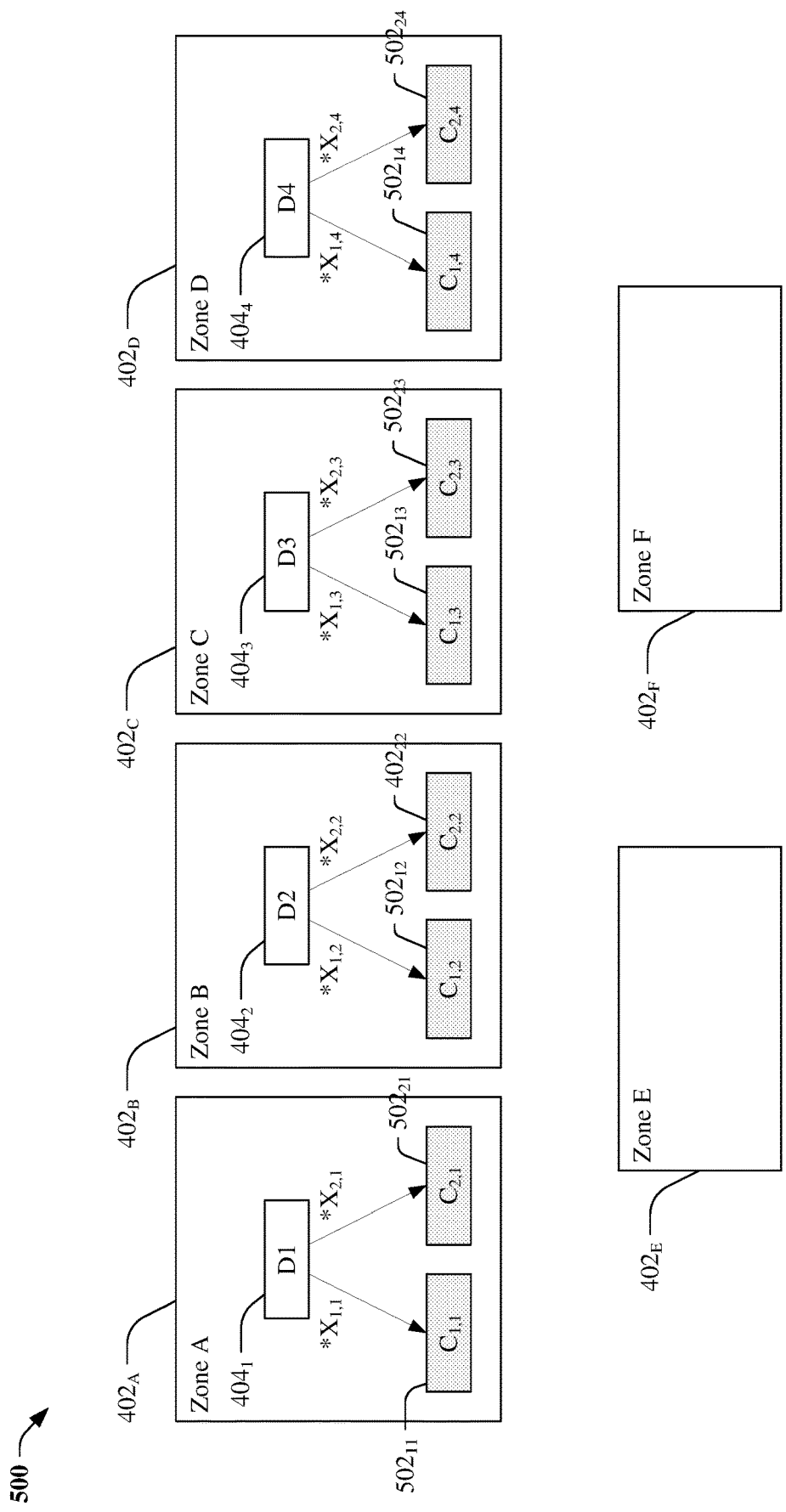
FIG. 5 illustrates an example system for creating partially-finished coding blocks during an initial phase of erasure coding.

Referring now to FIG. 5, there illustrated is an example system 500 for creating partially-finished coding blocks during an initial phase of erasure coding. During this initial phase of erasure coding, each zone, zone A $402_A$, zone B $402_B$, zone C $402_C$, zone D $402_D$, can create a chunk (D1 $404_1$, D2 $404_2$, D3 $404_3$, and D4 $404_4$, respectively) with user data (e.g., received from one or more storage clients). Each chunk $D_i$ (wherein i is an integer) is a data chunk $D_i$ to be encoded. According to an aspect, each of the zones (zone A $402_A$, zone B $402_B$, zone C $402_C$, zone D $402_D$) can generate a set of partially-finished coding chunks from the data chunk (D1-D4 respectively) that it stores. As an example, a defined coding matrix is utilized to determine coefficients $X_{i,j}$. The partially-finished coding chunks ($C_{1,1}$ $502_{11}$, $C_{2,1}$ $502_{21}$, $C_{1,2}$ $502_{12}$, $C_{2,2}$ $502_{22}$, $C_{1,3}$ $502_{13}$, $C_{2,3}$ $502_{23}$, $C_{1,4}$ $502_{14}$, $C_{2,4}$ $502_{24}$) can be determined (e.g., via partial encoding component 202) by combining the data chunks with the corresponding coefficients. In one example, partially-finished coding chunks ($G_{i,j}$) can be determined as follows:

$$C_{1,1}=D1*X_{1,1} \quad (3)$$

$$C_{2,1}=D1*X_{2,1} \quad (4)$$

$$C_{1,2}=D2*X_{1,2} \quad (5)$$

$$C_{2,2}=D2*X_{2,2} \quad (6)$$

$$C_{1,3}=D3*X_{1,3} \quad (7)$$

$$C_{2,3}=D3*X_{2,3} \quad (8)$$

$$C_{1,4}=D4*X_{1,4} \quad (9)$$

$$C_{2,4}=D4*X_{2,4} \quad (10)$$

The frontend zones A-D ($402_A$-$402_D$) can consolidate these partially-finished coding chunks ($G_{i,j}$) prior to transferring them to the remote zones E and F ($402_E$-$402_F$) to reduce input network traffic for the remote zones E and F ($402_E$-$402_F$) and/or to improve network traffic balance between frontend zones ($402_A$-$402_D$) and backend zones ($402_E$-$402_F$) without increase of a total inter-zone network traffic.

Figure 6:
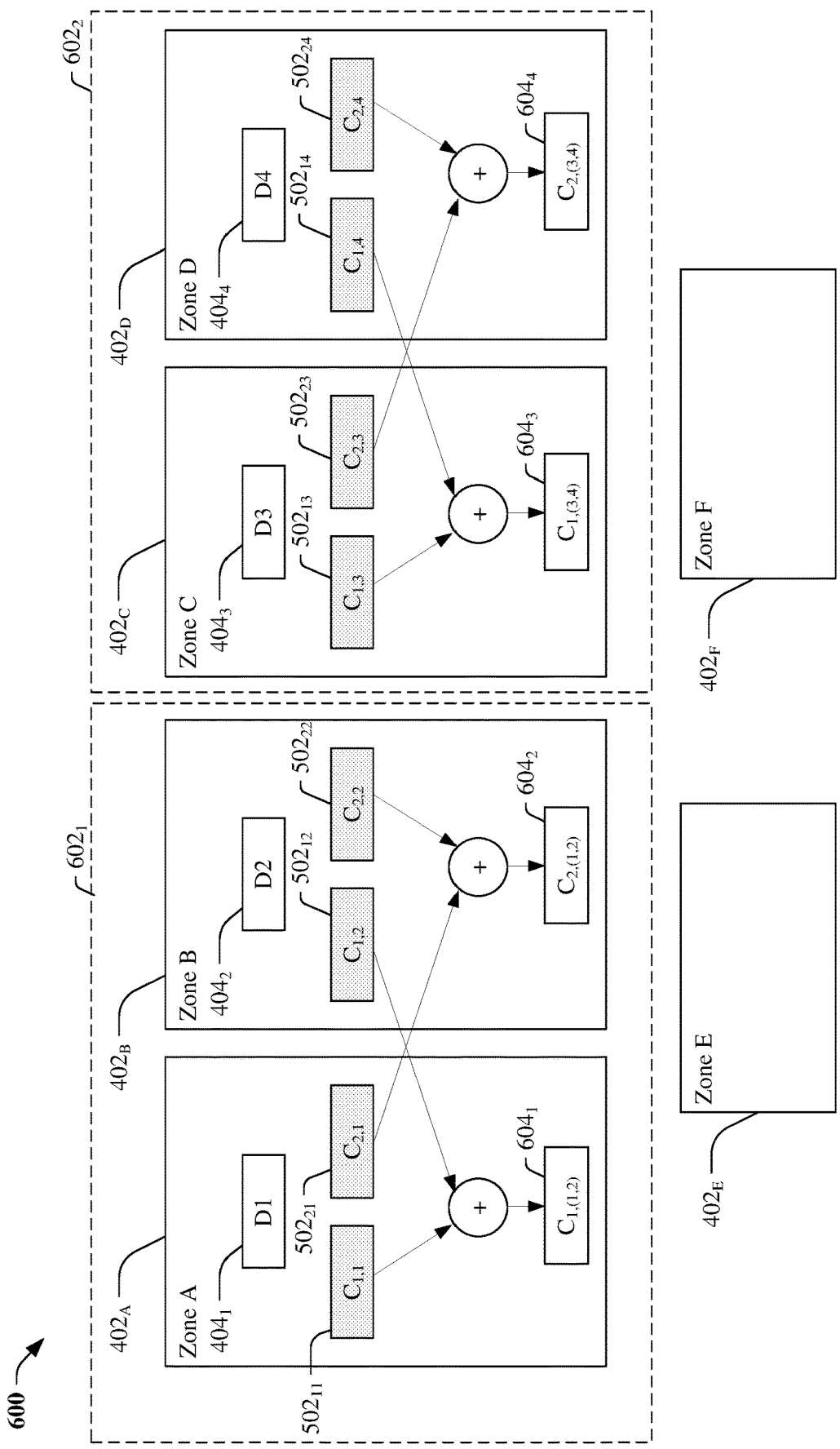
FIG. 6 illustrates an example system for consolidating partially-finished coding blocks during a second phase of erasure coding.

FIG. 6 illustrates an example system 600 for consolidating partially-finished coding blocks during a second phase of erasure coding. During this intermediate phase of erasure coding, the frontend zones ($402_A$-$402_D$) can be grouped into a plurality of consolidating groups. Typically, for a k+m erasure coding configuration, each consolidating group can comprise m zones. For example, a first consolidating group $602_1$ can comprise zone A $402_A$ and zone B $402_B$, while a second consolidating group $602_2$ can comprise zone C $402_C$ and zone D $402_D$. In an aspect, the assignments of zones to the consolidating groups can be random, based on various parameters (e.g., zone location, zone serial number/identifier, etc.), based on network operator preferences and/or policies, and/or can be learned based on machine learning.

According to an embodiment, zones within a consolidating group can exchange a portion of the partially-finished coding chunks they have generated during the first phase. For example, in the first consolidating group $602_1$, zone A $402_A$ can transfer the partially-finished coding chunk $C_{2,1}$ ($502_{21}$) to zone B $402_B$ and receive the partially-finished coding chunk $C_{1,2}$ ($502_{12}$) from zone B $402_B$. Similarly, in the second consolidating group $602_2$, zone C $402_C$ can transfer the partially-finished coding chunk $C_{2,3}$ ($502_{23}$) to zone D $402_D$ and receive the partially-finished coding chunk $C_{1,4}$ ($502_{14}$) from zone D $402_D$. Moreover, a zone can collect m partially-finished coding chunks that belong to a specific finished coding chunk (i) and combine them into a consolidated partial coding chunk (e.g., via a consolidation component 206). For example, zone A $402_A$ can collect partially-finished coding chunks $C_{1,1}$ ($502_{11}$) and $C_{1,2}$ ($502_{12}$) related to finished coding chunk $C_1$ (e.g., i=1) and can consolidate them into $C_{1,(1,2)}$ ($604_1$). Similarly, zone B $402_B$ can collect partially-finished coding chunks $C_{2,1}$ ($502_{21}$) and $C_{2,2}$ ($502_{22}$) related to finished coding chunk $C_2$ (e.g., i=2) and can consolidate them into $C_{2,(1,2)}$ ($604_2$); zone C $402_C$ can collect partially-finished coding chunks $C_{1,3}$ ($502_{13}$) and $C_{1,4}$ ($502_{14}$) related to finished coding chunk C (e.g., i=1) and can consolidate them into $C_{1,(3,4)}$ ($604_3$); zone D $402_D$ can collect partially-finished coding chunks $C_{2,3}$ ($502_{23}$) and $C_{2,4}$ ($502_{24}$) related to finished coding chunk $C_2$ (e.g., i=2) and can consolidate them into $C_{2,(3,4)}$ ($604_4$). This is the second phase of encoding.

In an aspect, after the consolidated partial coding chunk ($604_1$-$604_4$) for a given data chunk is generated, the data chunk is fully protected with replication. Moreover, the consolidated partial coding chunks ($604_1$-$604_4$) comprise sufficient information to perform a complete recovery of a data chunk if the latter is lost. Therefore, subsequent to generation of the consolidated partial coding chunks ($604_1$-$604_4$), the partially-finished coding chunks ($502_{11}$, $502_{21}$, $502_{12}$, $502_{22}$, $502_{13}$, $502_{23}$, $502_{14}$, and $502_{24}$) can be deleted. Further, the consolidated partial coding chunks ($604_1$-$604_4$) can be transferred to respective backend zones (e.g., zone E $402_E$ and zone F $402_F$). For example, consolidated partial coding chunks $C_{1,j}$ are transferred to zone E $402_E$ and consolidated partial coding chunks $C_{2,j}$ are transferred to zone F $402_F$. In one aspect, zones A-D can create the consolidated partial coding chunks ($C_{i,j}$) as real chunks that are stored in the zones A-D. Alternatively, in another aspect, one or more of the zones A-D can transform partially-finished coding chunks to the consolidated partial coding chunks (e.g., via summation) on the fly, for example, while streaming data to remote zones (E and/or F).

Figure 7:
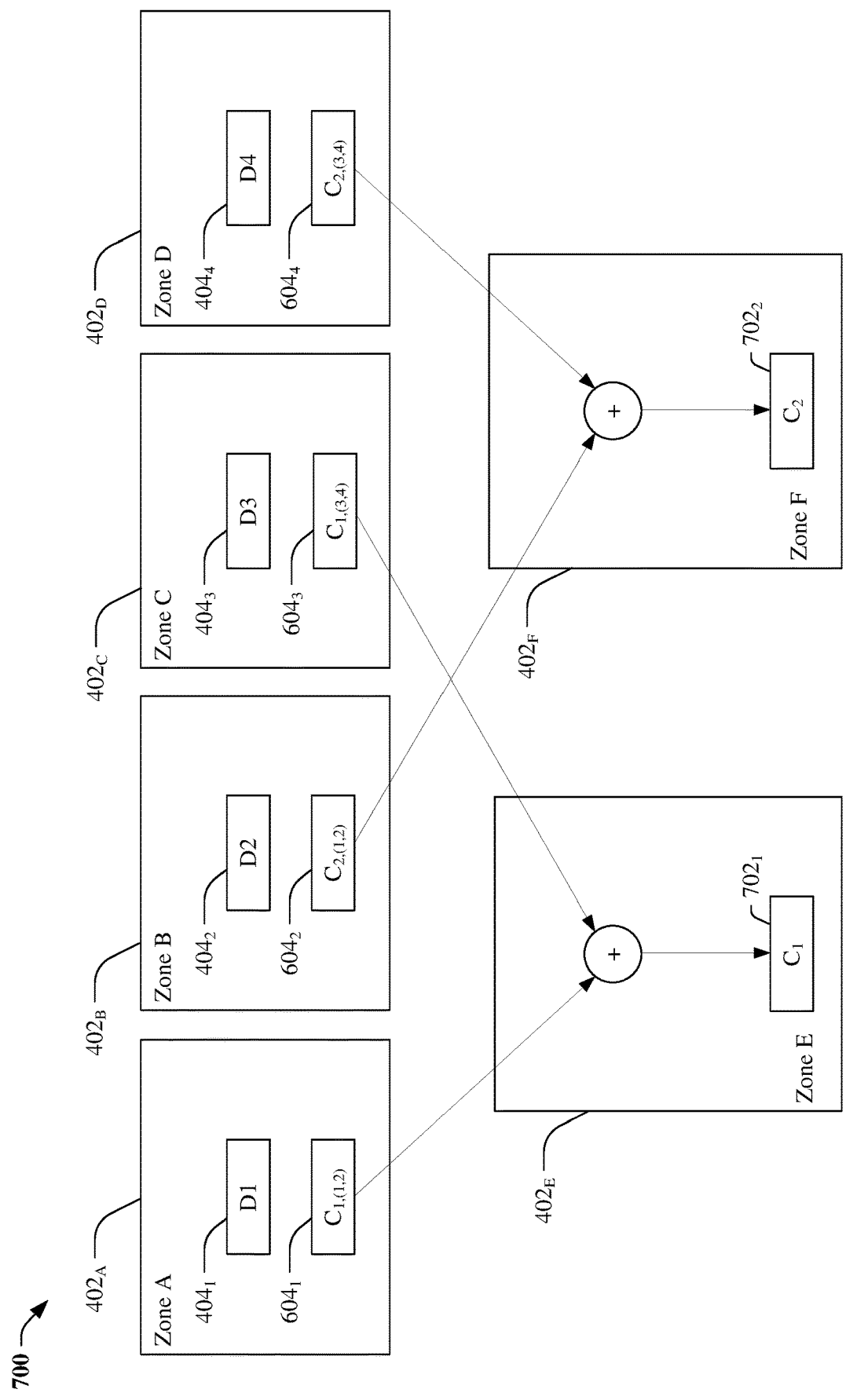
FIG. 7 illustrates an example system for generating complete coding chunks during a final phase of erasure coding.

FIG. 7 illustrates an example system 700 for generating complete coding chunks during a final phase of erasure coding. In one aspect, the remote zones receive (e.g., via the reception component 302) the consolidated partial coding chunks generated from the partially-finished coding chunks. For example, zone E $402_E$ can receive consolidated partial coding chunks $C_{1,(1,2)}$ ($604_1$) and $C_{1,(3,4)}$ ($604_3$) from zone A $402_A$ and zone C $402_C$, respectively, and zone F $402_F$ can receive consolidated partial coding chunks $C_{2,(1,2)}$ ($604_2$) and $C_{2,(3,4)}$ ($604_4$) from zone B $402_B$ and zone D $402_D$, respectively. According to an aspect, the remote zones, zone E $402_E$ and zone F $402_F$, can determine complete/finished coding chunks (e.g., via the coding chunk generation component 304) based on combining the received information. For example, zone E $402_E$ can generate a coding chunk $C_1$ $702_1$ based on combining (e.g., adding) consolidated partial coding chunks $C_{1,(1,2)}$ ($604_1$) and $C_{1,(3,4)}$ ($604_3$), and zone F $402_F$ can generate a coding chunk $C_2$ $702_2$ based on combining (e.g., adding) consolidated partial coding chunks $C_{2,(1,2)}$ ($604_2$) and $C_{2,(3,4)}$ ($604_4$). Since there are no primary backup copies of data chunks, each remote zone can generate the coding chunk independently (e.g., without communicating with each other). This eliminates the necessity to distribute coding chunks between the remote zones after encoding is completed.

Figure 8:
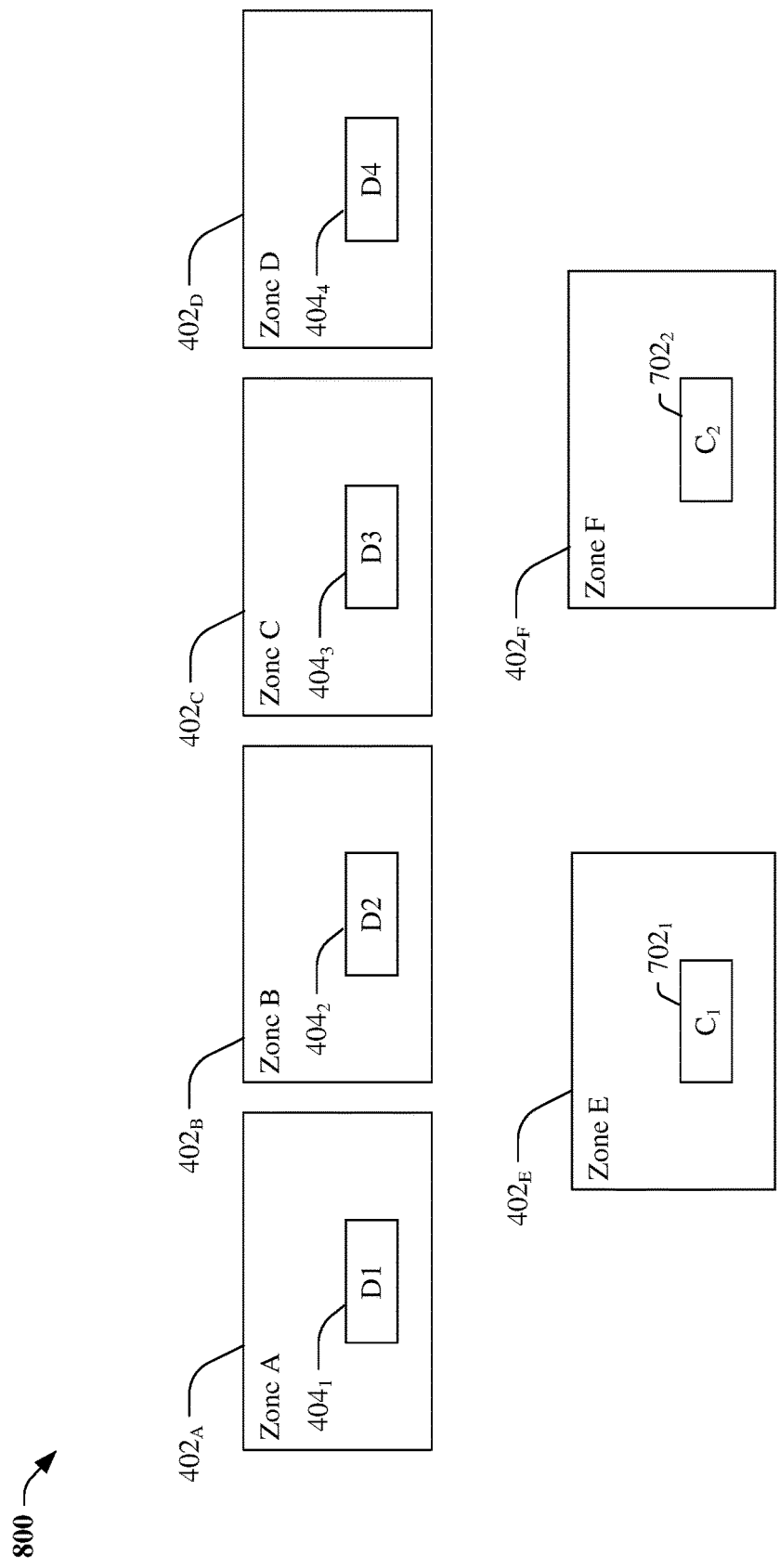
FIG. 8 illustrates an example system that depicts a data layout after encoding has been completed.

FIG. 8 illustrates an example system 800 that depicts a data layout after encoding has been completed. In an aspect, the consolidated partial coding chunks, $C_{1,(1,2)}$ ($604_1$), $C_{2,(1,2)}$ ($604_2$), $C_{1,(3,4)}$ ($604_3$), and $C_{2,(3,4)}$ ($604_4$) can be deleted.

Figure 9:
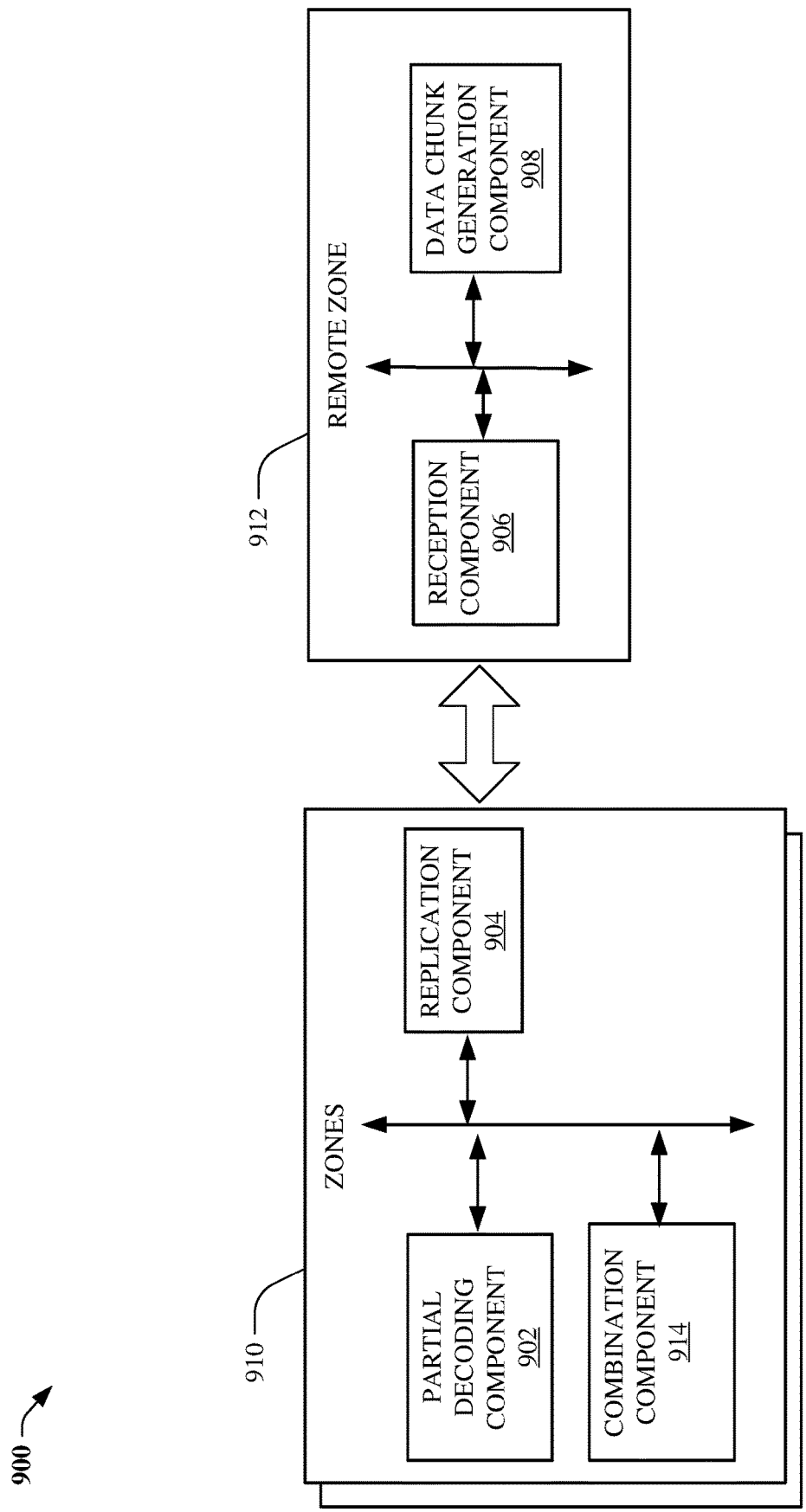
FIG. 9 illustrates an example system for recovery of data chunks, according to an aspect of the specification.

Referring now to FIG. 9, there illustrated is an example system 900 for recovery of data chunks, according to an aspect of the specification. Decoding is an inverse operation for the above described distributed encoding mechanism. In one aspect, a decoding matrix can be utilized for decoding that is different from the coding matrix (e.g., the coefficients in the coding and decoding matrices are different). According to an aspect, on determining that one or more zones have failed and/or are unavailable, the remaining available zones 910 (e.g., available backend zones and frontend zones) can provide their chunk (e.g., data and/or coding chunk) for decoding (e.g., during disaster recovery). For example, a partial decoding component 902 can perform an initial phase of decoding, wherein the data chunk can be combined with (e.g., multiplied by) the corresponding coefficients of the decoding matrix to generate a set of partially-finished data chunks. Additionally, or optionally, a combination component 914 can perform an intermediate phase of decoding, wherein a group of partially-finished data chunks can be combined to generate consolidated partial data chunks. Further, a replication component 904 can provide the set of consolidated partial data chunk (and/or partially-finished data chunks) to one or more remote zones 912. The reception component 906 can receive the set of consolidated partial data chunks (and/or partially-finished data chunks) and a data chunk generation component 908 can combine the set of consolidated partial data chunks (and/or partially-finished data chunks) to recover the lost data chunk.

In one aspect, if there are two or more data chunks to recover, the data chunks can be recovered with minimal coordination in a distributed fashion by different remote zones 912. Each remote zone sums (e.g., via their data chunk generation component 908) the consolidated partial data chunks (and/or partially-finished data chunks) it has generated and/or has received, to produce a complete data chunk.

Figure 10:
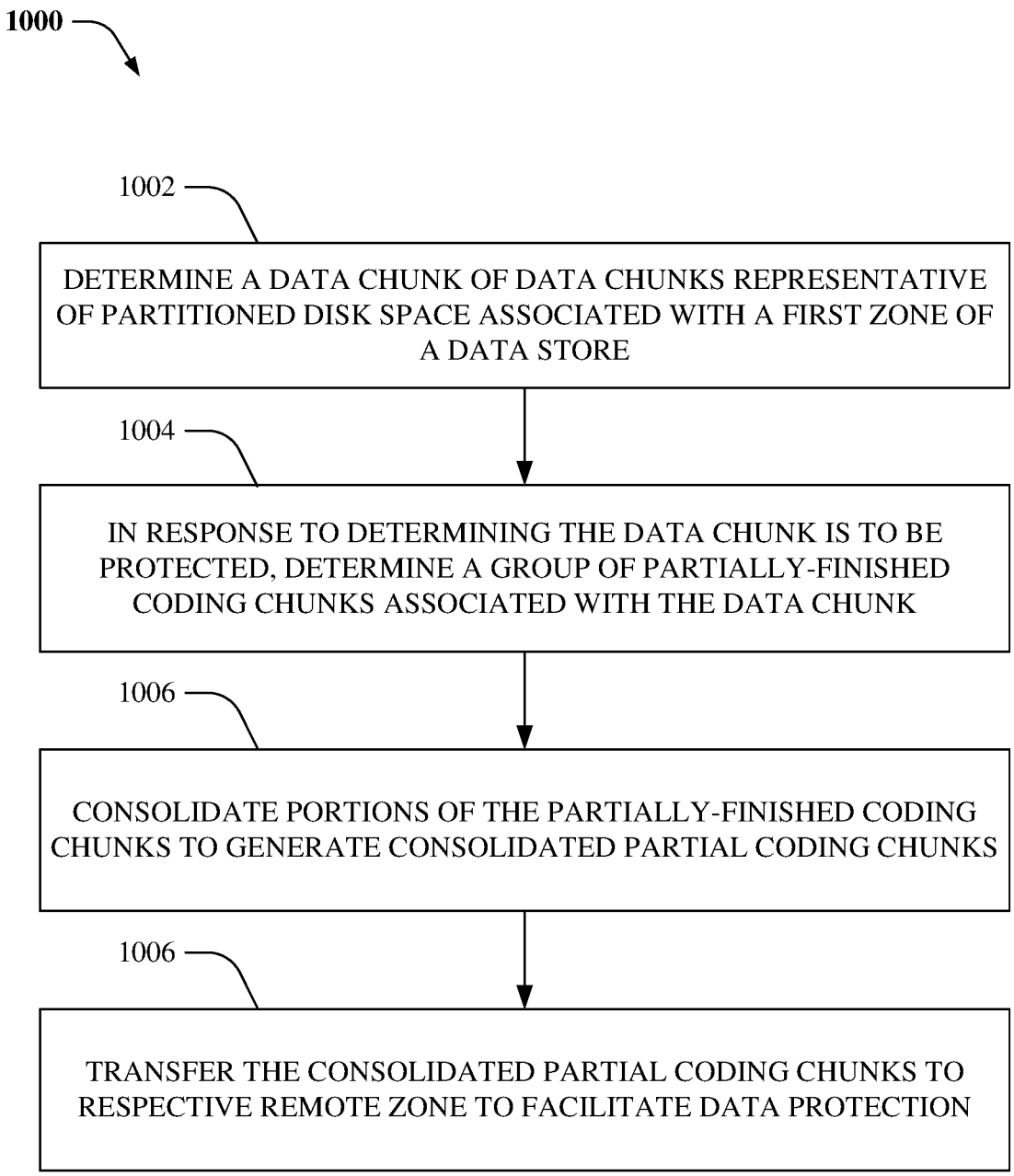
FIG. 10 illustrates an example method that facilitates distributed erasure coding.
Figure 11:
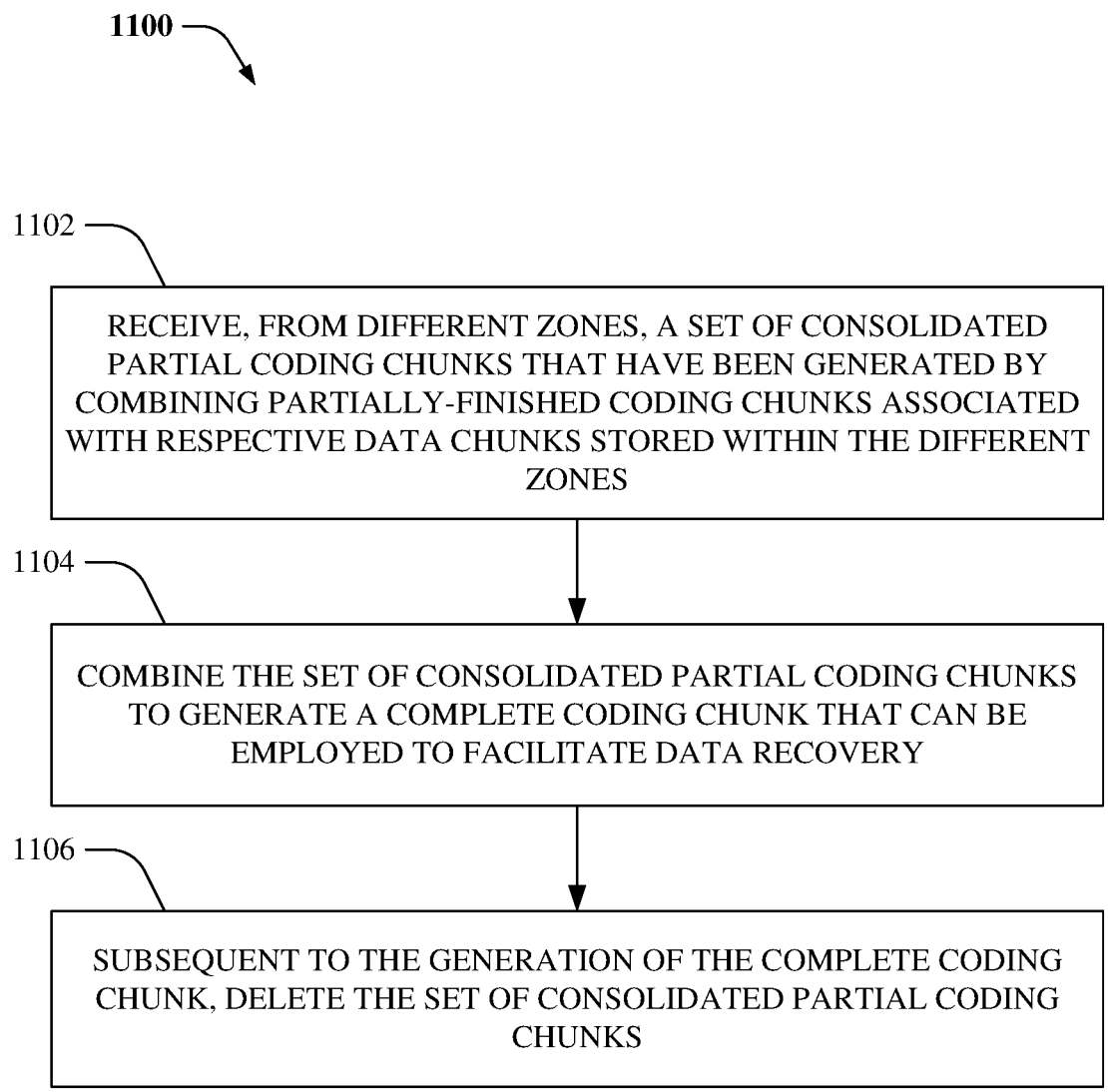
FIG. 11 illustrates an example method that facilitates generation of coding chunks, according to an aspect of the specification.

FIGS. 10-11 illustrate flow diagrams and/or methods in accordance with the disclosed subject matter. For simplicity of explanation, the flow diagrams and/or methods are depicted and described as a series of acts. It is to be understood and appreciated that the various embodiments are not limited by the acts illustrated and/or by the order of acts, for example acts can occur in various orders and/or concurrently, and with other acts not presented and described herein. Furthermore, not all illustrated acts may be required to implement the flow diagrams and/or methods in accordance with the disclosed subject matter. In addition, those skilled in the art will understand and appreciate that the methods could alternatively be represented as a series of interrelated states via a state diagram or events. Additionally, it should be further appreciated that the methods disclosed hereinafter and throughout this specification are capable of being stored on an article of manufacture to facilitate transporting and transferring such methods to computers. The term article of manufacture, as used herein, is intended to encompass a computer program accessible from any computer-readable device or computer-readable storage/communications media.

Referring now to FIG. 10, there illustrated is an example method 1000 that facilitates distributed erasure coding. At 1002, a data chunk, of data chunks representative of partitioned disk space associated with a first zone of a data store can be determined. In response to the determining that the data chunk is to be protected, at element 1004, a group of partially-finished coding chunks can be generated. As an example, the group of partially-finished coding chunks can be generated by combining (e.g., multiplying) the data chunk with corresponding coefficients from a defined coding matrix. At 1006, portions of the of partially-finished coding chunks can be consolidated. For example, for a k+m erasure coding configuration, a consolidated partial coding chunk can comprise k/m partially-finished coding chunks that belong to a common finished/complete coding chunk. At 1008, the consolidated partial coding chunks can be transferred to respective remote zones to facilitate protection of the data chunk. In an aspect, the remote zones can utilize the consolidated partial coding chunks to generate complete coding chunks that can be utilized for data recovery in case the data chunk is lost/unavailable.

FIG. 11 illustrates an example method 1100 that facilitates generation of coding chunks, according to an aspect of the specification. At 1102, a set of consolidated partial coding chunks can be received from different zones. As an example, the consolidated partial coding chunks can be generated based on combining (e.g., adding) a set of partially-finished coding chunks that are associated with a common finished/complete coding chunk. Moreover, the partially-finished coding chunks can be determined based on multiplying data chunks with corresponding coefficients from a defined coding matrix. At 1104, the consolidated partial coding chunks can be combined (e.g., added) to generate a complete coding chunk that can be utilized to facilitate data recovery (e.g., in case the data chunks are lost/unavailable). At 1106, subsequent to the generation of the complete coding chunk, the set of consolidated partial coding chunks can be deleted.

Figure 12:
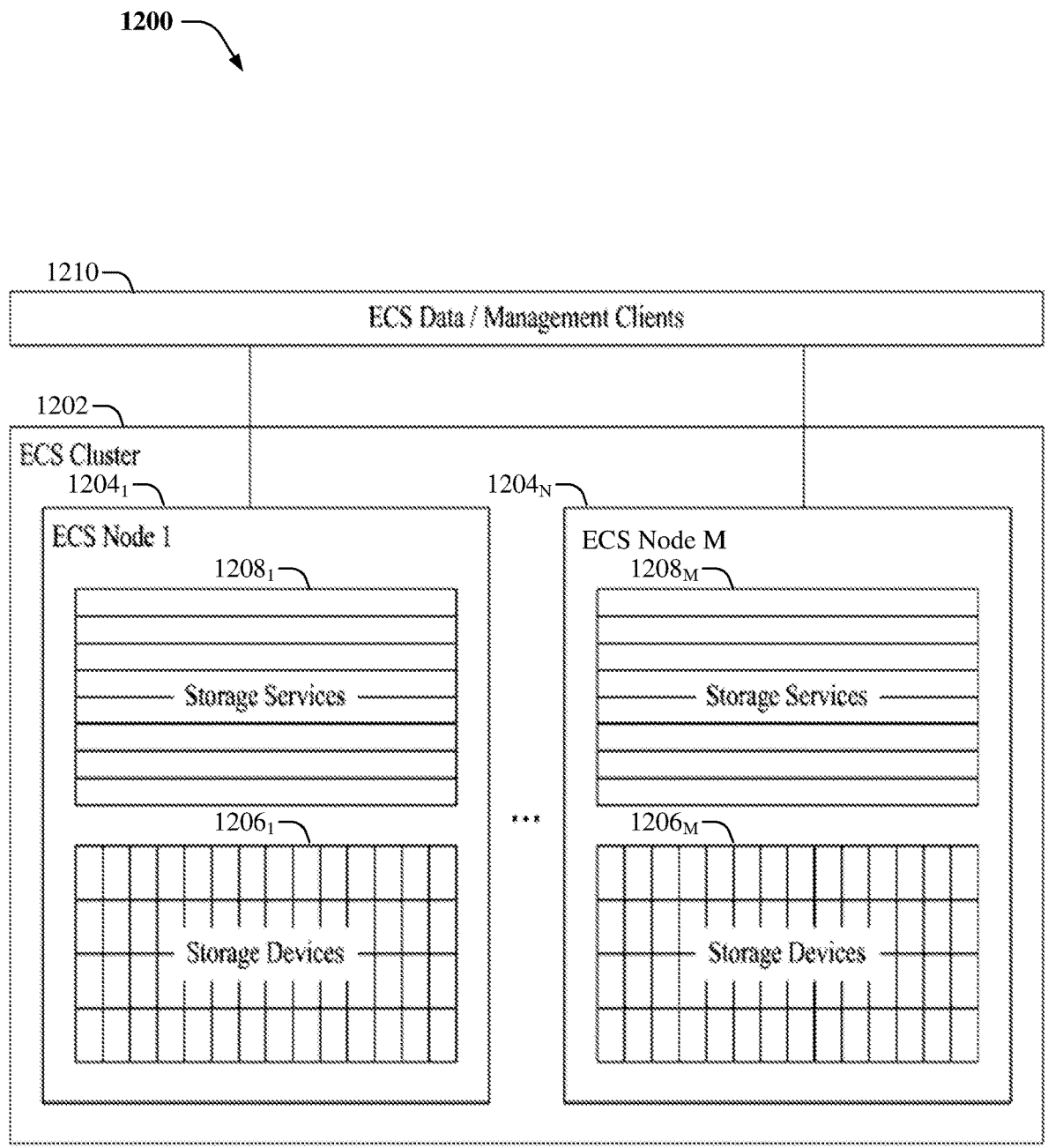
FIG. 12 illustrates high-level architecture of an Elastic Cloud Storage (ECS™) cluster that facilitates enhanced data protection and/or recovery via consolidated erasure coding.

FIG. 12 illustrates an example high-level architecture 1200 of an ECS™ cluster, according to an aspect of the subject disclosure. ECS™ can comprise a software-defined, cloud-scale, object storage platform that combines the cost advantages of commodity infrastructure with the reliability, availability and serviceability of traditional arrays. With ECS™, an organization can deliver scalable and simple public cloud services with the reliability and control of a private-cloud infrastructure. ECS™ provides comprehensive protocol support for unstructured (object and/or file) workloads on a single, cloud-scale storage platform. In an aspect, the ECS™ cluster 1202 can comprise multiple nodes $1204_1$-$1204_M$, wherein M is most any integer. It is noted that the ECS™ cluster 1202 can be substantially similar to zones described herein, for example, frontend zones $102_1$-$102_k$, backend zones $104_1$-$104_m$, frontend zone 200, backend zone 300, zones A-F ($402_A$-$402_F$), etc. The nodes $1204_1$-$1204_M$ can comprise storage devices (e.g. hard drives) $1206_1$-$1206_M$ and can run a set of services $1208_1$-$1208_M$. For example, single node that runs ECS™ version 3.0 can manage 20 independent services. Further, ECS™ data/management clients 1210 can be coupled to the nodes $1204_1$-$1204_M$.

The ECS™ cluster 1202 does not protect user data with traditional schemes like mirroring or parity protection. Instead, the ECS™ cluster 1202 utilizes a k+m erasure coding protection scheme, wherein a data block (e.g., data chunk) is divided into k data fragments and m coding fragments are created (e.g., by encoding the k data fragments). Encoding is performed in a manner such that the ECS™ cluster 1202 can tolerate the loss of any m fragments. As an example, the default scheme for ECS™ is 12+4, i.e. k equals to 12 and m equals to 4; however, the subject disclosure is not limited to this erasure coding protection scheme. When some fragments are lost, the missing fragments are restored via a decoding operation.

In one aspect, the storage services $1208_1$-$1208_M$ can handle data availability and protection against data corruption, hardware failures, and/or data center disasters. As an example, the storage services $1208_1$-$1208_M$ can comprise an unstructured storage engine (USE) (not shown), which is a distributed shared service that runs on each node $1204_1$-$1204_M$, and manages transactions and persists data to nodes. The USE enables global namespace management across geographically dispersed data centers through geo-replication. In an aspect, the USE can write all object-related data (such as, user data, metadata, object location data) to logical containers of contiguous disk space known as chunks. Chunks are open and accepting writes, or closed and not accepting writes. After chunks are closed, the USE can erasure-code them. The USE can write to chunks in an append-only pattern so that existing data is never overwritten or modified. This strategy improves performance because locking and cache validation is not required for I/O operations. All nodes $1204_1$-$1204_M$ can process write requests for the same object simultaneously while writing to different chunks.

ECS™ continuously monitors the health of the nodes $1204_1$-$1204_M$, their disks, and objects stored in the cluster. ECS™ disperses data protection responsibilities across the cluster, it can automatically re-protect at-risk objects when nodes or disks fail. When there is a failure of a node or drive in the site, the USE can identify the chunks and/or erasure coded fragments affected by the failure and can write copies of the affected chunks and/or erasure coded fragments to good nodes and disks that do not currently have copies.

Private and hybrid clouds greatly interest customers, who are facing ever-increasing amounts of data and storage costs, particularly in the public cloud space. ECS™ provides a scale-out and geo-distributed architecture that delivers an on-premise cloud platform that scales to exabytes of data with a TCO (Total Cost of Ownership) that's significantly less than public cloud storage. Further, ECS™ provides versatility, hyper-scalability, powerful features, and use of low-cost industry standard hardware.

Figure 13:
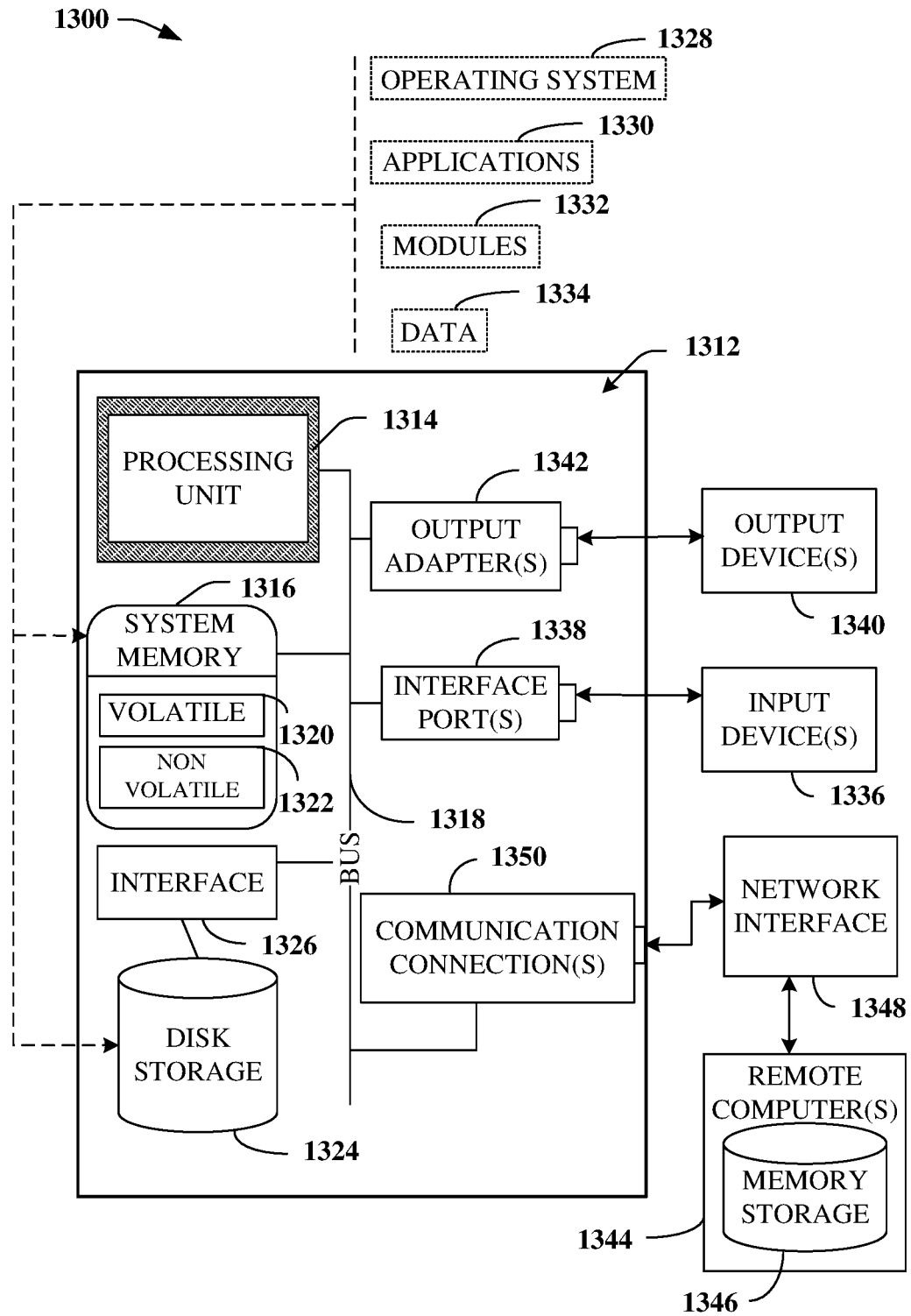
FIG. 13 illustrates a block diagram of an example computer operable to execute the disclosed storage system architecture.

Referring now to FIG. 13, there is illustrated a block diagram of an example computer operable to execute the distributed erasure coding. In order to provide additional context for various aspects of the disclosed subject matter, FIG. 13 and the following discussion are intended to provide a brief, general description of a suitable computing environment 1300 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the specification can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, (e.g., a carrier wave or other transport mechanism), and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

In order to provide a context for the various aspects of the disclosed subject matter, FIG. 13, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that various embodiments disclosed herein can be implemented in combination with other program modules. Generally, program modules comprise routines, programs, components, data structures, etc. that perform particular tasks and/or implement particular abstract data types.

Moreover, those skilled in the art will appreciate that the inventive systems can be practiced with other computer system configurations, comprising single-processor or multiprocessor computer systems, computing devices, mini-computing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communication network; however, some if not all aspects of the subject disclosure can be practiced on stand-alone computers. In a distributed computing environment, program modules can be located in both local and remote memory storage devices.

With reference to FIG. 13, a block diagram of a computing system 1300 operable to execute the disclosed systems and methods is illustrated, in accordance with an embodiment. Computer 1312 comprises a processing unit 1314, a system memory 1316, and a system bus 1318. As an example, the component(s), server(s), node(s), cluster(s), system(s), zone(s), module(s), agent(s), engine(s), and/or device(s) disclosed herein with respect to systems 100-900 and 1200 can each include at least a portion of the computing system 1300. System bus 1318 couples system components comprising, but not limited to, system memory 1316 to processing unit 1314. Processing unit 1314 can be any of various available processors. Dual microprocessors and other multiprocessor architectures also can be employed as processing unit 1314.

System bus 1318 can be any of several types of bus structure(s) comprising a memory bus or a memory controller, a peripheral bus or an external bus, and/or a local bus using any variety of available bus architectures comprising, but not limited to, industrial standard architecture (ISA), micro-channel architecture (MSA), extended ISA (EISA), intelligent drive electronics (IDE), VESA local bus (VLB), peripheral component interconnect (PCI), card bus, universal serial bus (USB), advanced graphics port (AGP), personal computer memory card international association bus (PCMCIA), Firewire (IEEE 1394), small computer systems interface (SCSI), and/or controller area network (CAN) bus used in vehicles.

System memory 1316 comprises volatile memory 1320 and nonvolatile memory 1322. A basic input/output system (BIOS), containing routines to transfer information between elements within computer 1312, such as during start-up, can be stored in nonvolatile memory 1322. By way of illustration, and not limitation, nonvolatile memory 1322 can comprise ROM, PROM, EPROM, EEPROM, or flash memory. Volatile memory 1320 comprises RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1312 also comprises removable/non-removable, volatile/non-volatile computer storage media. FIG. 13 illustrates, for example, disk storage 1324. Disk storage 1324 comprises, but is not limited to, devices like a magnetic disk drive, floppy disk drive, tape drive, Jaz drive, Zip drive, LS-100 drive, flash memory card, or memory stick. In addition, disk storage 1324 can comprise storage media separately or in combination with other storage media comprising, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1324 to system bus 1318, a removable or non-removable interface is typically used, such as interface 1326.

It is to be appreciated that FIG. 13 describes software that acts as an intermediary between users and computer resources described in suitable operating environment 1300. Such software comprises an operating system 1328. Operating system 1328, which can be stored on disk storage 1324, acts to control and allocate resources of computer system 1312. System applications 1330 take advantage of the management of resources by operating system 1328 through program modules 1332 and program data 1334 stored either in system memory 1316 or on disk storage 1324. It is to be appreciated that the disclosed subject matter can be implemented with various operating systems or combinations of operating systems.

A user can enter commands or information into computer 1312 through input device(s) 1336. Input devices 1336 comprise, but are not limited to, a pointing device such as a mouse, trackball, stylus, touch pad, touch screen, keyboard, microphone, joystick, game pad, satellite dish, scanner, TV tuner card, digital camera, digital video camera, web camera, cellular phone, user equipment, smartphone, and the like. These and other input devices connect to processing unit 1314 through system bus 1318 via interface port(s) 1338. Interface port(s) 1338 comprise, for example, a serial port, a parallel port, a game port, a universal serial bus (USB), a wireless based port, e.g., Wi-Fi, Bluetooth®, etc. Output device(s) 1340 use some of the same type of ports as input device(s) 1336.

Thus, for example, a USB port can be used to provide input to computer 1312 and to output information from computer 1312 to an output device 1340. Output adapter 1342 is provided to illustrate that there are some output devices 1340, like display devices, light projection devices, monitors, speakers, and printers, among other output devices 1340, which use special adapters. Output adapters 1342 comprise, by way of illustration and not limitation, video and sound devices, cards, etc. that provide means of connection between output device 1340 and system bus 1318. It should be noted that other devices and/or systems of devices provide both input and output capabilities such as remote computer(s) 1344.

Computer 1312 can operate in a networked environment using logical connections to one or more remote computers, such as remote computer(s) 1344. Remote computer(s) 1344 can be a personal computer, a server, a router, a network PC, a workstation, a microprocessor based appliance, a peer device, or other common network node and the like, and typically comprises many or all of the elements described relative to computer 1312.

For purposes of brevity, only a memory storage device 1346 is illustrated with remote computer(s) 1344. Remote computer(s) 1344 is logically connected to computer 1312 through a network interface 1348 and then physically and/or wirelessly connected via communication connection 1350. Network interface 1348 encompasses wire and/or wireless communication networks such as local-area networks (LAN) and wide-area networks (WAN). LAN technologies comprise fiber distributed data interface (FDDI), copper distributed data interface (CDDI), Ethernet, token ring and the like. WAN technologies comprise, but are not limited to, point-to-point links, circuit switching networks like integrated services digital networks (ISDN) and variations thereon, packet switching networks, and digital subscriber lines (DSL).

Communication connection(s) 1350 refer(s) to hardware/ software employed to connect network interface 1348 to bus 1318. While communication connection 1350 is shown for illustrative clarity inside computer 1312, it can also be external to computer 1312. The hardware/software for connection to network interface 1348 can comprise, for example, internal and external technologies such as modems, comprising regular telephone grade modems, cable modems and DSL modems, wireless modems, ISDN adapters, and Ethernet cards.

The computer 1312 can operate in a networked environment using logical connections via wired and/or wireless communications to one or more remote computers, cellular based devices, user equipment, smartphones, or other computing devices, such as workstations, server computers, routers, personal computers, portable computers, microprocessor-based entertainment appliances, peer devices or other common network nodes, etc. The computer 1312 can connect to other devices/networks by way of antenna, port, network interface adaptor, wireless access point, modem, and/or the like.

The computer 1312 is operable to communicate with any wireless devices or entities operatively disposed in wireless communication, e.g., a printer, scanner, desktop and/or portable computer, portable data assistant, communications satellite, user equipment, cellular base device, smartphone, any piece of equipment or location associated with a wirelessly detectable tag (e.g., scanner, a kiosk, news stand, restroom), and telephone. This comprises at least Wi-Fi and Bluetooth® wireless technologies. Thus, the communication can be a predefined structure as with a conventional network or simply an ad hoc communication between at least two devices.

The computing system 1300 is operable to communicate with any wireless devices or entities operatively disposed in wireless communication, e.g., desktop and/or portable computer, server, communications satellite, etc. This includes at least WiFi and Bluetooth® wireless technologies. Thus, the communication can be a predefined structure as with a conventional network or simply an ad hoc communication between at least two devices.

WiFi, or Wireless Fidelity, allows connection to the Internet from a couch at home, a bed in a hotel room, or a conference room at work, without wires. WiFi is a wireless technology similar to that used in a cell phone that enables such devices, e.g., computers, to send and receive data indoors and out; anywhere within the range of a base station. WiFi networks use radio technologies called IEEE 802.11 (a, b, g, n, etc.) to provide secure, reliable, fast wireless connectivity. A WiFi network can be used to connect computers to each other, to the Internet, and to wired networks (which use IEEE 802.3 or Ethernet). WiFi networks operate in the unlicensed 5 GHz radio band at a 54 Mbps (802.11a) data rate, and/or a 2.4 GHz radio band at an 11 Mbps (802.11b), a 54 Mbps (802.11g) data rate, or up to a 600 Mbps (802.11n) data rate for example, or with products that contain both bands (dual band), so the networks can provide real-world performance similar to the basic 10BaseT wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. In an aspect, when a processor executes instructions to perform "operations", this could include the processor performing the operations directly and/or facilitating, directing, or cooperating with another device or component to perform the operations In the subject specification, terms such as "data store," "data storage," "database," "cache," and substantially any other information storage component relevant to operation and functionality of a component, refer to "memory components," or entities embodied in a "memory" or components comprising the memory. It is noted that the memory components, or computer-readable storage media, described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated aspects of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Furthermore, the terms "user," "consumer," "client," and the like are employed interchangeably throughout the subject specification, unless context warrants particular distinction(s) among the terms. It is noted that such terms can refer to human entities or automated components/devices supported through artificial intelligence (e.g., a capacity to make inference based on complex mathematical formalisms), which can provide simulated vision, sound recognition and so forth.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

Artificial intelligence based systems, e.g., utilizing explicitly and/or implicitly trained classifiers, can be employed in connection with performing inference and/or probabilistic determinations and/or statistical-based determinations as in accordance with one or more aspects of the disclosed subject matter as described herein. For example, an artificial intelligence system can be used to dynamically perform operations as described herein.

A classifier can be a function that maps an input attribute vector, $x=(x1, x2, x3, x4, xn)$, to a confidence that the input belongs to a class, that is, $f(x)=$confidence (class). Such classification can employ a probabilistic and/or statistical-based analysis (e.g., factoring into the analysis utilities and costs) to infer an action that a user desires to be automatically performed. In the case of communication systems, for example, attributes can be information received from access points, servers, components of a wireless communication network, etc., and the classes can be categories or areas of interest (e.g., levels of priorities). A support vector machine is an example of a classifier that can be employed. The support vector machine operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein can also be inclusive of statistical regression that is utilized to develop models of priority.

In accordance with various aspects of the subject specification, artificial intelligence based systems, components, etc. can employ classifiers that are explicitly trained, e.g., via a generic training data, etc. as well as implicitly trained, e.g., via observing characteristics of communication equipment, e.g., a server, etc., receiving reports from such communication equipment, receiving operator preferences, receiving historical information, receiving extrinsic information, etc. For example, support vector machines can be configured via a learning or training phase within a classifier constructor and feature selection module. Thus, the classifier(s) can be used by an artificial intelligence system to automatically learn and perform a number of functions.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
    a processor; and
    a memory that stores executable instructions that, when executed by the processor, facilitate performance of operations, comprising:
        receiving a first consolidated partial coding chunk from a first zone of a group of zones of a geographically distributed storage system, wherein the first consolidated partial coding chunk is determined based on performing a first portion of an erasure coding operation that combines first partial coding chunks that are determined based on encoding data chunks stored within the group of zones;
        receiving a second consolidated partial coding chunk from a second zone of the group of zones, wherein the second consolidated partial coding chunk is determined based on performing the first portion of the erasure coding operation that combines second partial coding chunks that are determined based on the encoding of the data chunks; and
        performing a second portion of the erasure coding operation that comprises combining the first consolidated partial coding chunk and the second consolidated partial coding chunk to generate a final coding chunk.

2. The system of claim 1, wherein the combining the first consolidated partial coding chunk and the second consolidated partial coding chunk comprises adding the first consolidated partial coding chunk and the second consolidated partial coding chunk.

3. The system of claim 1, wherein the first partial coding chunks are determined based on defined coding matrix data.

4. The system of claim 3, wherein the defined coding matrix data comprises a set of defined coefficients, and wherein a first partial coding chunk of the first partial coding chunks is determined based on a result of multiplying a first data chunk of the data chunks with a coefficient of the set of defined coefficients.

5. The system of claim 1, wherein the operations further comprise:
    subsequent to generation of the final coding chunk, deleting the first consolidated partial coding chunk and the second consolidated partial coding chunk.

6. The system of claim 1, wherein the final coding chunk is employable to recover at least one of the data chunks during a failure.

7. The system of claim 6, wherein the at least one of the data chunks is recovered based on defined decoding matrix data.

8. The system of claim 1, wherein the geographically distributed storage system comprises a geographically distributed object storage system.

9. The system of claim 1, wherein the operations further comprise:
    storing the final coding chunk within a data store of a third zone of the geographically distributed storage system.

10. A method, comprising:
    receiving, by a system comprising a processor, a first consolidated partial coding chunk from a first zone of zones within a geographically distributed storage system, wherein the first consolidated partial coding chunk has been determined based on aggregating first partial coding chunks, and wherein the first partial coding chunks have been determined based on encoding data chunks stored within the zones by utilizing a specified erasure coding configuration;
    receiving, by the system, a second consolidated partial coding chunk from a second zone of the zones, wherein the second consolidated partial coding chunk has been determined based on aggregating second partial coding chunks, and wherein the second partial coding chunks have been determined based on the encoding of the data chunks; and
    based on aggregating the first consolidated partial coding chunk and the second consolidated partial coding chunk determining, by the system, a final coding chunk that is employable for recovery of at least one of the data chunks during a failure.

11. The method of claim 10, further comprising:
    storing the final coding chunk within a data store of a third zone of the zones.

12. The method of claim 11, further comprising:
    in response to the storing, deleting the first consolidated partial coding chunk and the second consolidated partial coding chunk.

13. The method of claim 10, wherein the aggregating the first partial coding chunks comprises adding the first partial coding chunks.

14. The method of claim 13, wherein the adding comprises adding the first partial coding chunks that are determined to be related to the final coding chunk.

15. A computer-readable storage medium comprising instructions that, in response to execution, cause a server device comprising a processor to perform operations, comprising:
    in response to determining that data chunks stored within respective zones of a geographically distributed storage system are to be protected via erasure coding, determining groups of partial coding chunks that are partially encoded versions of the data chunks;
    transferring a portion of the groups of partial coding chunks between the zones to facilitate a determination of consolidated partial coding chunks, wherein a consolidated partial coding chunk, of the consolidated partial coding chunks, is generated based on combining a set of the partial coding chunks that are determined to be related to a common complete coding chunk; and
    facilitating a replication of the consolidated partial coding chunk to a remote zone of the geographically distributed storage system to facilitate a generation of the common complete coding chunk that is employable to recover at least one of the data chunks during a failure.

16. The computer-readable storage medium of claim 15, wherein the determining the groups of partial coding chunks comprises determining the groups of partial coding chunks based on defined coding matrix data.

17. The computer-readable storage medium of claim 16, wherein the defined coding matrix data is indicative of coefficients employable to facilitate the erasure coding, and wherein the groups of partial coding chunks are determined based on combining the data chunks with corresponding coefficients of the coefficients.

18. The computer-readable storage medium of claim 17, wherein the remote zone is a replication destination for the respective zones, and wherein the remote zone is coupled to the respective zones via one or more devices of a wide area network.

19. The computer-readable storage medium of claim 15, wherein the consolidated partial coding chunk is determined based on a summation of the set of the partial coding chunks.

20. The computer-readable storage medium of claim 15, wherein the geographically distributed storage system comprises a geographically distributed object storage system.

* * * * *